United States Patent
Jeon et al.

(10) Patent No.: US 8,547,081 B2
(45) Date of Patent: Oct. 1, 2013

(54) REFERENCE VOLTAGE SUPPLY CIRCUIT INCLUDING A GLITCH REMOVER

(75) Inventors: Young Deuk Jeon, Daejeon (KR); Young Kyun Cho, Daejeon (KR); Jae Won Nam, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 535 days.

(21) Appl. No.: 12/833,841

(22) Filed: Jul. 9, 2010

(65) Prior Publication Data
US 2011/0018629 A1 Jan. 27, 2011

(30) Foreign Application Priority Data

Jul. 27, 2009 (KR) .................. 10-2009-0068485
Apr. 1, 2010 (KR) .................. 10-2010-0029810

(51) Int. Cl.
*G05F 1/00* (2006.01)
*G05F 3/16* (2006.01)
*G05F 3/20* (2006.01)

(52) U.S. Cl.
USPC ............ 323/313; 323/280; 323/314; 323/316

(58) Field of Classification Search
USPC ..................... 323/280, 284, 313, 314, 316
See application file for complete search history.

(56) References Cited

U.S. PATENT DOCUMENTS

| 5,519,309 | A | * | 5/1996 | Smith | 323/316 |
| 5,990,711 | A | * | 11/1999 | Sekimoto | 327/112 |
| 6,452,422 | B1 | * | 9/2002 | Suzuki | 326/112 |
| 7,091,770 | B2 | * | 8/2006 | Schlaffer | 327/541 |
| 2003/0184273 | A1 | * | 10/2003 | Nakajima | 323/314 |
| 2006/0125463 | A1 | * | 6/2006 | Yen et al. | 323/316 |

FOREIGN PATENT DOCUMENTS

| JP | 2007-074294 | 3/2007 |
| KR | 1020030046665 A | 6/2003 |
| KR | 1020060098551 A | 9/2006 |
| KR | 1020080035366 A | 4/2008 |

* cited by examiner

*Primary Examiner* — Adolf Berhane
*Assistant Examiner* — Gary Nash (57) ABSTRACT

A reference voltage supply circuit is provided. The reference voltage supply circuit includes a first amplifier for amplifying a first input voltage and a fed back first reference voltage, a second amplifier for amplifying a second input voltage and a fed back second reference voltage, a reference voltage generator for generating the first reference voltage and the second reference voltage according to output signals of the first and second amplifiers and feeding the first and second reference voltages back to the first and second amplifiers, and a glitch remover turned on/off according to an input pulse signal to conduct or cut off current flowing between a power supply terminal and the ground.

17 Claims, 5 Drawing Sheets

REFERENCE VOLTAGE SUPPLY CIRCUIT INCLUDING A GLITCH REMOVER

CROSS-REFERENCE TO RELATED APPLICATION

This application claims priority to and the benefit of Korean Patent Application Nos. 10-2009-0068485 filed Jul. 27, 2009 and 10-2010-0029810 filed Apr. 1, 2010, the disclosure of which is incorporated herein by reference in its entirety.

BACKGROUND

1. Field of the Invention

The present invention relates to a reference voltage supply circuit, and more particularly to a reference voltage supply circuit generating a dynamic voltage, which functions to supply electric charge to a capacitive load connected with the reference voltage supply circuit or remove charge stored in the capacitive load, to remove a glitch caused by movement of charge.

2. Discussion of Related Art

With the development of imaging technology, an amplifier circuit used in an image sensor (e.g., a complementary metal oxide semiconductor (CMOS) image sensor) has been actively developed lately. A switched-capacitor (SC) circuit used in a programmable gain amplifier (PGA) circuit is currently attracting attention among the developed amplifier circuits.

A general SC circuit performs a sample and hold (S/H) operation, an amplification/attenuation operation, a multiplying digital-to-analog converter (MDAC) operation, a filtering operation, etc. as a switch connected to a capacitor is driven by a clock, and so on. In this process, a reference voltage is connected to one or both of two plates constituting the capacitor through a switch. The reference voltage is supplied from a reference voltage supply circuit that stably supplies a constant voltage to a target circuit regardless of an environmental change. Such a reference voltage supply circuit is essential in driving an analog circuit such as an analog-digital converter (ADC), a phase-locked loop (PLL), and a filter circuit. The power consumption of the reference voltage supply circuit is about one fifth to half the power consumption of the overall analog circuit, which is too large to be ignored. In particular, when an SC circuit is used in a high-resolution image sensor, large current is required to satisfy the corresponding resolution. In this case, power consumed by the reference voltage supply circuit may exceed half the power consumption of the overall analog circuit.

Figure 1A:
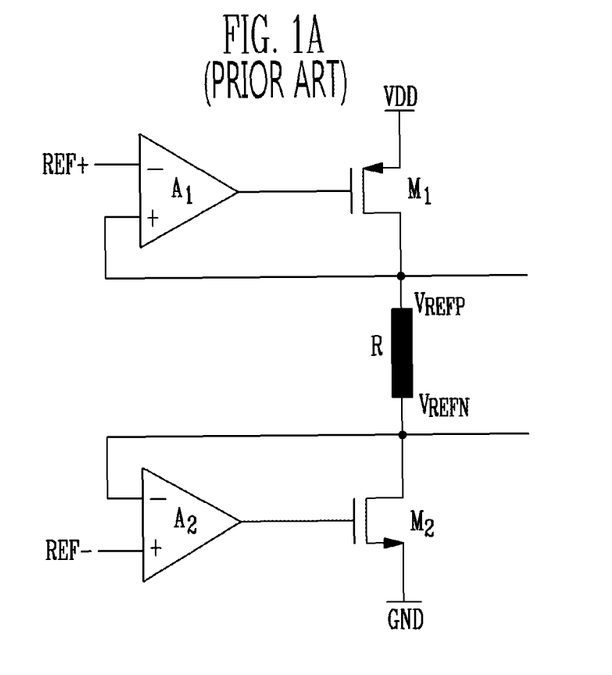
FIGS. 1A to 1C are circuit diagrams of conventional reference voltage supply circuits.
Figure 1B:
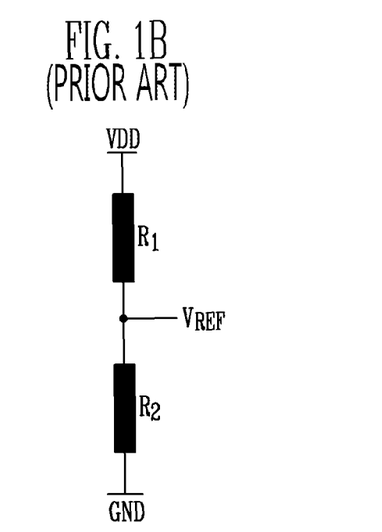
Figure 1C:
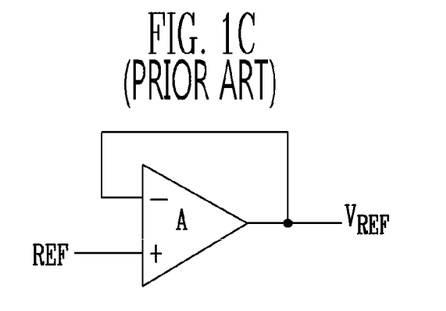

FIGS. 1A to 1C are circuit diagrams of general reference voltage supply circuits.

A reference voltage supply circuit may be a circuit generating differential reference voltages $V_{REFP}$ and $V_{REFN}$ as shown in FIG. 1A. Such a circuit for generating the differential reference voltages $V_{REFP}$ and $V_{REFN}$ is frequently used to supply a reference voltage to an ADC. Meanwhile, a reference voltage supply circuit may be a circuit generating one reference voltage $V_{REF}$ as a form used in a circuit requiring a common mode voltage. To be specific, a reference voltage supply circuit may generate a constant reference voltage $V_{REF}$ by adjusting the values of resistors $R_1$ and $R_2$ as shown in FIG. 1B, or may generate a constant reference voltage $V_{REF}$ by applying a feedback to an amplifier as shown in FIG. 1C.

Figure 2A:
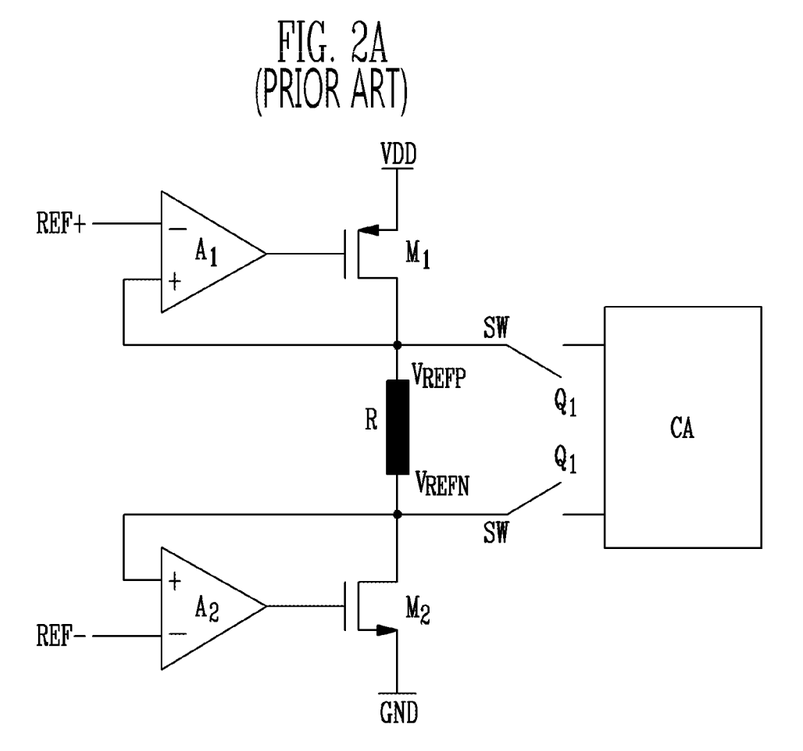
FIG. 2A is a circuit diagram of the reference voltage supply circuit shown in FIG. 1A to which a capacitor array is connected.

FIG. 2A is a circuit diagram of the reference voltage supply circuit of a pipeline ADC shown in FIG. 1A to which a capacitor array CA is connected.

As shown in FIG. 2A, in the reference voltage supply circuit, a feedback with a gain of 1 is applied to a two-stage amplifier circuit including two amplifiers $A_1$ and $A_2$ and two transistors $A_1$ and $A_2$. A resistor R may be connected between the two amplifiers $A_1$ and $A_2$, so that the two amplifiers $A_1$ and $A_2$ can be correlated with each other.

When voltages REF+ and REF− are input to the two amplifiers $A_1$ and $A_2$, differential reference voltages $V_{REFP}$ and $V_{REFN}$ having the same level are generated with the resistor R interposed between the differential reference voltages $V_{REFP}$ and $V_{REFN}$, and static current generated according to a difference between the two voltages $V_{REFP}$ and $V_{REFN}$ and the resistance value of the resistor R flows.

Figure 2B:
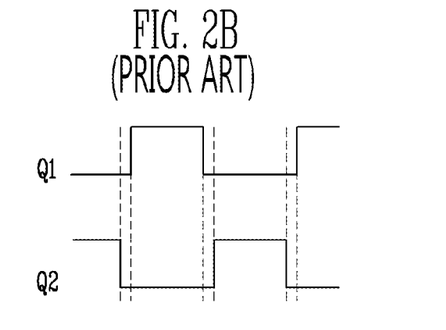
FIG. 2B is a time table illustrating operation of a clock signal employed in the reference voltage supply circuit of FIG. 2A.

FIG. 2B is a time table illustrating operation of a clock driving a switch SW between the reference voltage supply circuit and the capacitor array CA of FIG. 2A.

When a clock Q2 is in its on-state, the switch SW between the capacitor array CA and the reference voltage supply circuit is turned off, and the capacitor array CA and the reference voltage supply circuit do not influence each other. On the other hand, as soon as a clock Q1 is switched to its on-state, the reference voltages $V_{REFP}$ and $V_{REFN}$ are connected to the lower plates of respective capacitors in the capacitor array CA. When the clock Q2 is switched to its on-state, the reference voltage supply circuit and the capacitor array CA are separated again, and thus the lower plates of the capacitors need to be fixed at the reference voltage $V_{REFP}$ or $V_{REFN}$ for the corresponding time. To this end, additional charge needs to be supplied to the capacitors, or a part of charge stored in the capacitors needs to be removed. During this process, a glitch momentarily occurs in the reference voltages $V_{REFP}$ and $V_{REFN}$. In a general ADC, charge needs to be supplied to a capacitor when a plate of the capacitor array CA is fixed at the reference voltage $V_{REFP}$, and charge previously stored in the capacitor needs to be removed when the plate of the capacitor array CA is fixed at the reference voltage $V_{REFN}$. Thus, the direction of the glitch is a (−) direction in the former case, and a (+) direction in the latter case. Meanwhile, the magnitude of a glitch is proportional to the capacitance of a load capacitor and inversely proportional to the current flowing through the resistor R. Thus, when the capacitance of the load capacitor is large in comparison with the voltage driving capability of the reference voltage supply circuit or the voltage driving capability of the reference voltage supply circuit is not sufficient, a large glitch occurs. Then, the settling time of a reference voltage lengthens, and a malfunction may occur.

To solve this problem, the voltage driving capability of the reference voltage supply circuit may be improved. However, in this case, static current continuously flowing regardless of a clock increases, and thus the power consumption of an overall circuit increases. In particular, an SC circuit used in a high-speed high-resolution image sensor requiring large static current leads to a significant increase in power consumption.

Consequently, it is urgently necessary to develop technology for removing a glitch caused by static current in a reference voltage supply circuit.

SUMMARY OF THE INVENTION

The present invention is directed to realizing an additional current path in a reference voltage supply circuit to supply a required voltage as soon as a glitch is caused by movement of charge, so that a reference voltage from which the glitch is removed can be supplied within a short time period.

The present invention is directed to minimizing static current even in a high-speed high-resolution circuit and also removing a glitch to minimize the power consumption of a reference voltage supply circuit and reduce a finally realized chip size.

One aspect of the present invention provides a reference voltage supply circuit including: a first amplifier for amplifying a first input voltage and a fed back first reference voltage; a second amplifier for amplifying a second input voltage and a fed back second reference voltage; a reference voltage generator for generating the first reference voltage and the second reference voltage according to output signals of the first and second amplifiers and feeding the first and second reference voltages back to the first and second amplifiers; and a glitch remover turned on/off according to an input pulse signal to conduct or cut off current flowing between a power supply terminal and the ground.

The reference voltage generator may include a first transistor, a resistor, and a second transistor connected in series. Here, output terminals of the first and second amplifiers may be connected to gates of the first and second transistors respectively, the first reference voltage may be generated from a connection node between the first transistor and the resistor, and the second reference voltage may be generated from a connection node between the second transistor and the resistor.

The first transistor may be a p-type transistor, and the second transistor may be an n-type transistor.

The glitch remover may include: a third transistor connected between the power supply terminal and a node from which the first reference voltage is generated; and a fourth transistor connected between a node from which the second reference voltage is generated and the ground.

First and second pulses may be applied to gates of the third and fourth transistors, and the third and fourth transistors may be turned on when the first and second pulses are applied.

The first pulse may be applied in an inverted form of the second pulse, and the second pulse may be synchronized with a clock signal driving a switch for connecting the nodes from which the first and second reference voltages are generated with a load and applied as soon as the clock signal is turned on.

The third transistor may be a p-type transistor, and the fourth transistor may be an n-type transistor.

Another aspect of the present invention provides a reference voltage supply circuit including: a reference voltage generator including first and second resistors connected in series between a power supply terminal and the ground, and generating a reference voltage from a connection node between the first and second resistors; and a glitch remover turned on/off according to an input pulse signal to conduct or cut off current flowing between the power supply terminal and the ground.

Still another aspect of the present invention provides a reference voltage supply circuit including: an amplifier for amplifying an input voltage and a fed back reference voltage; and a glitch remover turned on/off according to an input pulse signal to conduct or cut off current flowing between a power supply terminal and the ground.

The reference voltage may be generated from an output terminal of the amplifier.

The glitch remover may include: a first switch connected between the power supply terminal and the node from which the reference voltage is generated; and a second switch connected between the node from which the reference voltage is generated and the ground.

First and second pulses may be applied to the first and second switches, and the first and second switches may be turned on when the first and second pulses are applied.

The first pulse may be applied in an inverted form of the second pulse, and the second pulse may be synchronized with a clock signal driving a switch for connecting the node from which the reference voltage is generated with a load and applied as soon as the clock signal is turned on.

The first switch may be a p-type transistor, and the second switch may be an n-type transistor.

The reference voltage supply circuit may further include a pulse generator for generating the first and second pulses.

The pulse generator may include: a NAND gate for receiving the clock signal and the clock signal passed through an odd number of inverters as input signals; and at least one inverter connected with an output terminal of the NAND gate in sequence.

An output signal of the NAND gate or the output signal of the NAND gate passed through the at least one inverter may be the first or second pulse, and an odd number of inverters may be between output terminals of the first and second pulses.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the embodiments disclosed below but can be implemented in various forms. The following embodiments are described in order to enable those of ordinary skill in the art to embody and practice the present invention. To clearly describe the present invention, parts not relating to the description are omitted from the drawings. Like numerals refer to like elements throughout the description of the drawings.

Throughout this specification, when an element is referred to as being "connected" or "coupled" to another element, it can be directly connected or coupled to the other element or electrically connected or coupled to the other element with yet another element interposed between them.

Throughout this specification, when an element is referred to as "comprises," "includes," or "has" a component, it does not preclude another component but may further include the other component unless the context clearly indicates otherwise. Also, as used herein, the terms " . . . unit," " . . . device," " . . . module," etc., denote a unit of processing at least one function or operation, and may be implemented as hardware, software, or combination of hardware and software.

First Exemplary Embodiment

Figure 3A:
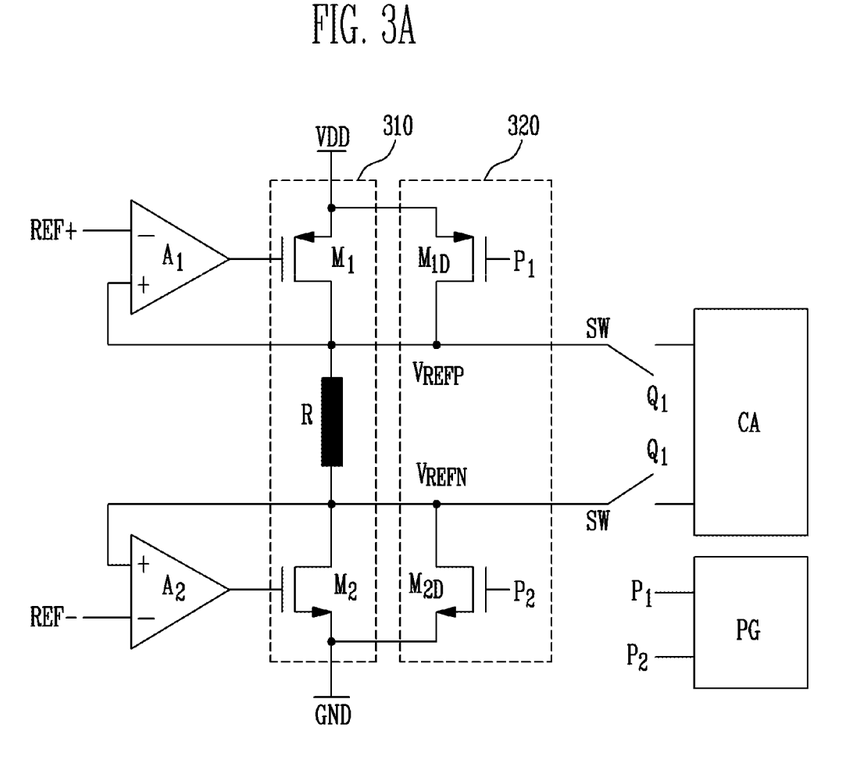
FIG. 3A is a circuit diagram of a reference voltage supply circuit according to a first exemplary embodiment of the present invention.

FIG. 3A is a circuit diagram of a reference voltage supply circuit according to a first exemplary embodiment of the present invention.

As shown in FIG. 3, the reference voltage supply circuit according to the first exemplary embodiment of the present invention may include two amplifiers $A_1$ and $A_2$ that amplify an input voltage and fed back reference voltages $V_{REFP}$ and $V_{REFN}$, a reference voltage generator 310 that generates the reference voltages $V_{REFP}$ and $V_{REFN}$ according to output signals of the amplifiers $A_1$ and $A_2$ and feeds the reference voltages $V_{REFP}$ and $V_{REFN}$ back to the amplifiers $A_1$ and $A_2$, and a glitch remover 320 that is turned on/off according to an input pulse signal to conduct or cut off current flowing between a power supply terminal VDD and a ground terminal GND.

The reference voltage generator 310 may include a first transistor $M_1$, a resistor R, and a second transistor $M_2$ that are connected in series. The output terminals of the amplifiers $A_1$ and $A_2$ are connected to the gates of the transistors $M_1$ and $M_2$ respectively, and the reference voltages $V_{REFP}$ and $V_{REFN}$ are differentially output from connection nodes between the transistors $M_1$ and $M_2$ and the resistor R.

Meanwhile, a deglitch circuit, which is the distinctive feature of an exemplary embodiment of the present invention, that is, the glitch remover 320, is a circuit for removing a glitch of a reference voltage. The glitch remover 320 includes two switches, which may be realized by transistors $M_{1D}$ and $M_{2D}$ respectively. The transistor $M_{1D}$ is connected between the power supply terminal VDD and a node from which the reference voltage $V_{REFP}$ is generated, and the transistor $M_{2D}$ is connected between a node from which the reference voltage $V_{REFN}$ is generated and the ground terminal GND. In other words, the sources and drains of the transistors $M_{1D}$ and $M_{2D}$ are connected to the sources and drains of the transistors $M_1$ and $M_2$ respectively. As shown in FIG. 3A, the transistors $M_1$ and $M_{1D}$ may be p-type transistors and the transistors $M_2$ and $M_{2D}$ may be n-type transistors, or vice versa. Alternatively, all the transistors may be n-type or p-type transistors.

Meanwhile, predetermined pulses $P_1$ and $P_2$ are applied to the gates of the transistors $M_{1D}$ and $M_{2D}$ included in the glitch remover 320. To this end, a pulse generator PG may be additionally included in the reference voltage supply circuit according to the first exemplary embodiment of the present invention.

The basic operation of the reference voltage supply circuit according to the first exemplary embodiment of the present invention is the same as that of a conventional reference voltage supply circuit. To be specific, when predetermined voltages REF+ and REF− are input to input terminals of the two amplifiers $A_1$ and $A_2$, the differential reference voltages $V_{REFP}$ and $V_{REFN}$ having the same level are generated with the resistor R interposed between the differential reference voltages $V_{REFP}$ and $V_{REFN}$, and static current flows through the resistor R according to a difference between the two differential reference voltages $V_{REFP}$ and $V_{REFN}$ and the resistance value of the resistor R.

Figure 3B:
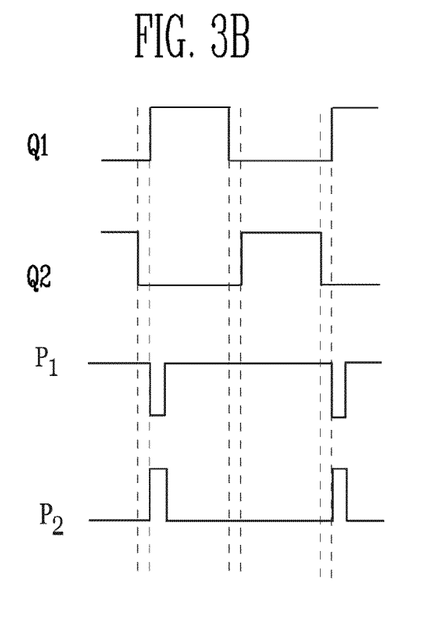
FIG. 3B is a time table illustrating operation of a clock signal and pulse signal employed in the reference voltage supply circuit of FIG. 3A.

With reference to FIG. 3B showing a time table of clocks that drive switches connecting the reference voltage supply circuit with a capacitor array CA and pulses that are applied to the two switches included in the glitch remover 320, detailed operation of the reference voltage supply circuit according to the first exemplary embodiment of the present invention will be described below.

When a clock Q2 is in its on-state, a switch SW between the capacitor array CA and the reference voltage supply circuit is turned off. As soon as a clock Q1 is switched to its on-state, the pulses $P_1$ and $P_2$ synchronized with the clock Q1 are input to the two switch input terminals constituting the glitch remover 320, that is, the gates of the transistors $M_{1D}$ and $M_{2D}$. The pulses $P_1$ and $P_2$ are intended to drive the transistors $M_{1D}$ and $M_{2D}$. In FIG. 3A, the two transistors $M_{1D}$ and $M_{2D}$ are p-type and n-type transistors respectively, and thus the pulses $P_1$ and $P_2$ for driving the transistors $M_{1D}$ and $M_{2D}$ are opposite to each other. However, the pulses $P_1$ and $P_2$ are not limited to opposite pulses, as long as they can drive the two transistors $M_{1D}$ and $M_{2D}$ included in the glitch remover 320.

When the pulses $P_1$ and $P_2$ are applied, the two transistors $M_{1D}$ and $M_{2D}$ are turned on for the corresponding time. The resistance of the turned-on transistors $M_{1D}$ and $M_{2D}$ is determined by the widths and lengths. Current determined by a combined resistance of the determined resistance of the transistors $M_{1D}$ and $M_{2D}$ and the resistance of the resistor R and the voltage of the power supply terminal VDD flows while the clock Q1 is in its on-state. The current flowing when the transistors $M_{1D}$ and $M_{2D}$ included in the glitch remover 320 are turned on serves to supply charge to capacitors of the capacitor array CA connected with the reference voltage supply circuit or remove charge stored in the capacitors. While the clock Q1 whereby the reference voltage supply circuit and the capacitor array CA are connected is in its on-state, the reference voltages $V_{REFP}$ and $V_{REFN}$ should be connected to the plates of the respective capacitors of the capacitor array CA. On the other hand, while the clock Q2 whereby the reference voltage supply circuit and the capacitor array CA are separated is in its on-state, charge should be additionally supplied to the capacitors, or charge stored in the capacitors should be removed. As a result, the plates of the capacitors should be fixed at the reference voltage $V_{REFP}$ or $V_{REFN}$ while the clock Q1 or Q2 is in its on-state. Here, additional current is generated by the glitch remover 320, and thus charge supply to the capacitors or charge removal from the capacitors can be facilitated. Thus, a glitch caused by additionally supplying charge to the capacitors or removing charge stored in the capacitors does not occur, and also power consumption can be minimized.

Second Exemplary Embodiment

Figure 4:
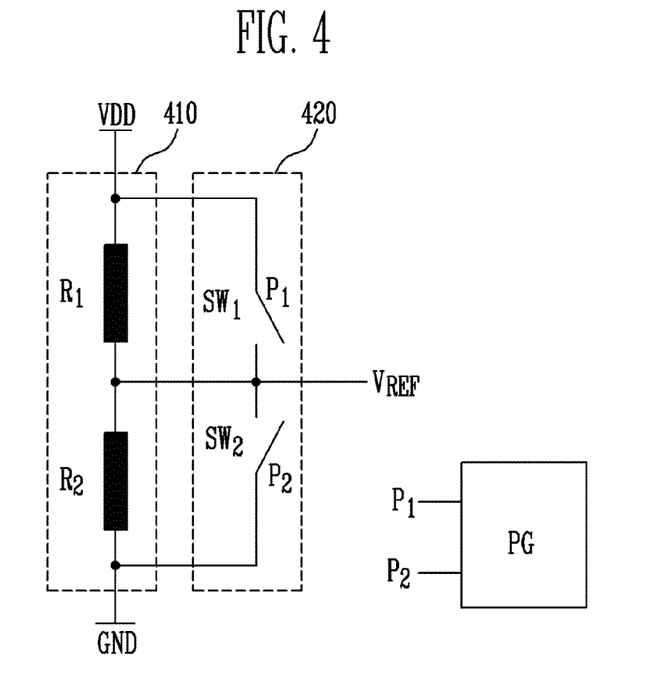
FIG. 4 is a circuit diagram of a reference voltage supply circuit according to a second exemplary embodiment of the present invention.

FIG. 4 is a circuit diagram of a reference voltage supply circuit according to a second exemplary embodiment of the present invention.

As shown in FIG. 4, the reference voltage supply circuit according to the second exemplary embodiment of the present invention has been improved from the conventional reference voltage supply circuit shown in FIG. 1B. To be specific, a glitch remover 420 is added to a reference voltage supply circuit including a reference voltage generator 410 that generates a constant reference voltage $V_{REF}$ between resistors $R_1$ and $R_2$ by adjusting the resistances of the resistors $R_1$ and $R_2$.

The glitch remover 420 is also a circuit for removing a glitch of a reference voltage, and has the same constitution as the glitch remover 320 shown in FIG. 3A. In other words, the glitch remover 420 may include two switches, and the two switches may be realized by transistors as shown in FIG. 3A or by mechanical switches $SW_1$ and $SW_2$ as shown in FIG. 4.

Both ends of the switches $SW_1$ and $SW_2$ are connected to both ends of the resistors $R_1$ and $R_2$, respectively. To be specific, the switch $SW_1$ is connected to the both ends of the resistor $R_1$ connected between a power supply terminal VDD and the output terminal of the reference voltage $V_{REF}$, and the switch $SW_2$ is connected to the both ends of the resistor $R_2$ connected between the output terminal of the reference voltage $V_{REF}$ and a ground terminal GND.

The switches $SW_1$ and $SW_2$ also are driven by predetermined pulses $P_1$ and $P_2$, and to this end, a pulse generator PG may be additionally included.

A glitch is removed by the glitch remover 420 in the same manner as described with reference to the reference voltage supply circuit of FIG. 3A and the time table of FIG. 3B, and the time table of clocks and pulses shown in FIG. 3B can also be applied to the reference voltage supply circuit shown in FIG. 4.

To be specific, as soon as a clock Q1 connecting the reference voltage supply circuit with a capacitor array is switched to its on-state, pulses $P_1$ and $P_2$ synchronized with the clock Q1 are input to two switches $SW_1$ and $SW_2$ constituting the glitch remover 420. The two switches $SW_1$ and $SW_2$ are momentarily turned on by the pulses $P_1$ and $P_2$, and predetermined current flows while the clock Q1 is in its on-state. The current serves to supply charge to capacitors of the capacitor array connected with the reference voltage supply circuit or remove charge stored in the capacitors, so that a glitch can be removed.

Third Exemplary Embodiment

Figure 5:
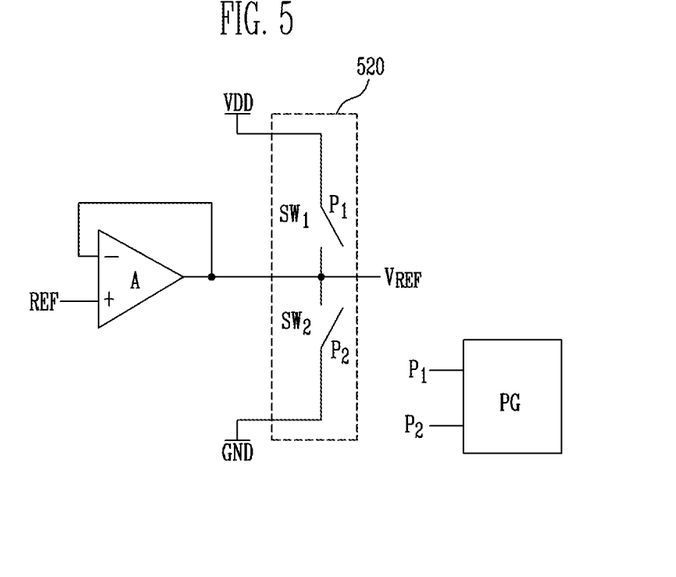
FIG. 5 is a circuit diagram of a reference voltage supply circuit according to a third exemplary embodiment of the present invention.

FIG. 5 is a circuit diagram of a reference voltage supply circuit according to a third exemplary embodiment of the present invention.

As shown in FIG. 5, the reference voltage supply circuit according to the third exemplary embodiment of the present invention has been improved from the conventional reference voltage supply circuit shown in FIG. 1C. To be specific, a glitch remover 520 is added to a reference voltage supply circuit that generates a constant reference voltage $V_{REF}$ by applying a feedback to an amplifier A.

The glitch remover 520 is also the same as the glitch remover 320 shown in FIG. 3A and the glitch remover 420 shown in FIG. 4. In other words, the glitch remover 520 may include two switches $SW_1$ and $SW_2$ realized by transistors or mechanical switches.

In the reference voltage supply circuit of FIG. 5, when a predetermined voltage REF is applied to an input terminal of the amplifier A, the reference voltage $V_{REF}$ is output to an output terminal. Here, the two switches $SW_1$ and $SW_2$ are connected between a power supply terminal VDD and the output terminal and between the output terminal and a ground terminal GND respectively, thereby removing a glitch.

The time table shown in FIG. 3B can also be applied to the reference voltage supply circuit of FIG. 5. As soon as a clock Q1 driving a switch whereby the reference voltage supply circuit and a capacitor array are connected is switched to its on-state, pulses $P_1$ and $P_2$ synchronized with the clock Q1 drive the two switches $SW_1$ and $SW_2$. For this reason, predetermined current flows while the clock Q1 is in its on-state, so that a glitch can be removed.

A detailed constitution of the pulse generator PG shown in FIGS. 3A, 4 and 5 will be described below.

Pulse Generator

Figure 6:
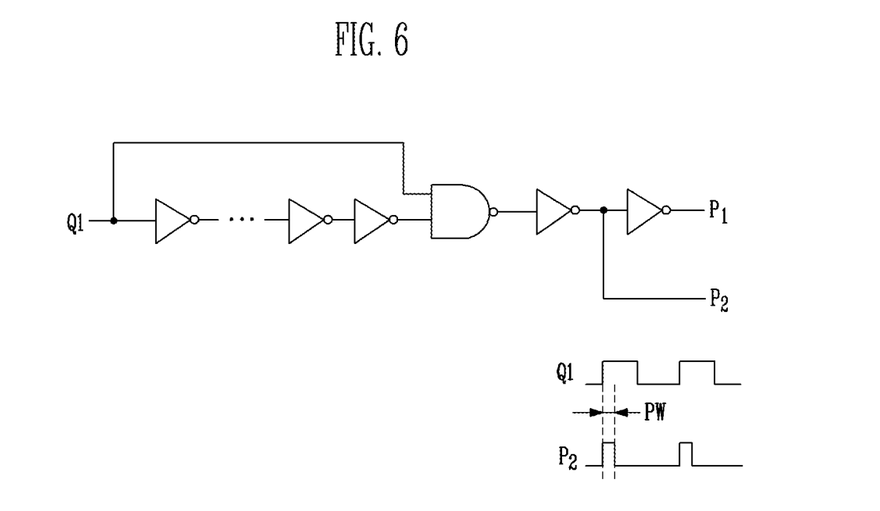
FIG. 6 is a circuit diagram of a pulse generator according to an exemplary embodiment of the present invention.

FIG. 6 is a logic circuit diagram of the pulse generator PG for generating the pulses $P_1$ and $P_2$ driving switches included in the glitch remover 320, 420 and 520 of FIGS. 3A, 4 and 5.

As shown in FIG. 6, the pulse generator PG according to an exemplary embodiment of the present invention includes inverters and a NAND gate N.

The pulse generator PG operates as follows.

A signal that needs to be synchronized with a pulse to be generated may be input to the input terminal of the pulse generator PG. In the reference voltage supply circuits of FIGS. 3A, 4 and 5, the signal should be synchronized with the clock Q1 that controls connection between the reference voltage supply circuits and a capacitor array, and thus the clock signal Q1 is input to the pulse generator PG. However, in a reference voltage supply circuit in which a glitch is caused by another signal, the signal other than the clock signal Q1 can be applied to the pulse generator PG.

The input signal Q1 follows two separate paths. The input signal Q1 following one of the two paths is input to the NAND gate N as is, and the input signal Q1 following the other one of the two paths is passed through an odd number of inverters and input to the NAND gate N. The input signal Q1 is delayed while passing through the odd number of inverters, and the inverted input signal Q1 is input to the NAND gate N. A signal output through the output terminal of the NAND gate N is passed through an appropriate number of inverters, and as a result, the pulses $P_1$ and $P_2$ are output. When two switches included in the glitch remover 320 are realized by the p-type transistor $M_{1D}$ and the n-type transistor $M_{2D}$ as shown in FIG. 3A, the pulse $P_1$ input to the p-type transistor $M_{1D}$ should be the inverse of the pulse $P_2$ input to the n-type transistor $M_{2D}$. Thus, the signal output through the output terminal of the NAND gate N can be appropriately controlled and inverted to generate the pulses $P_1$ and $P_2$. For example, as shown in FIG. 6, one inverter is added to the output terminal of the NAND gate N so that the pulse $P_2$ to be applied to the n-type transistor $M_{2D}$ can be output, and the pulse signal $P_2$ is inverted again so that the pulse $P_1$ to be applied to the p-type transistor $M_{1D}$ can be output.

Meanwhile, a width PW of the pulses $P_1$ and $P_2$ may be controlled by controlling the number of inverters added in front of the NAND gate N and the resultant delay. The width PW of the pulses $P_1$ and $P_2$ is related to the amount of charge supplied to a capacitor array or removed from the capacitor array. The larger the width PW of the pulses $P_1$ and $P_2$, the more the amount of moving charge. The smaller the width PW of the pulses $P_1$ and $P_2$, the less the amount of moving charge.

As described above, since an additional current path is realized in a reference voltage supply circuit according to an exemplary embodiment of the present invention, a required voltage is supplied through the current path as soon as a glitch is caused by movement of charge, which is necessary in maintaining a reference voltage, so that a reference voltage from which the glitch is removed can be obtained within a short time period.

Also, by an exemplary embodiment of the present invention, static current is minimized even in a high-speed high-resolution circuit, so that the power consumption of a reference voltage supply circuit can be minimized and also a finally realized chip size can be reduced.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A reference voltage supply circuit, comprising:
   a first amplifier configured to amplify a first input voltage and a first reference voltage;
   a second amplifier configured to amplify a second input voltage and a second reference voltage;
   a reference voltage generator configured to generate the first reference voltage and the second reference voltage according to output signals of the first and second amplifiers, respectively, to provide the first and second reference voltages to a first reference node and a second reference node, respectively, and to provide the first and second reference voltages to the first and second amplifiers, respectively; and
   a glitch remover configured to couple the first reference node and the second reference node to a power supply terminal and a ground terminal, respectively, in response to an input pulse signal for a predetermined time after the reference voltage generator is coupled to an external circuit through the first and second reference nodes.

2. The reference voltage supply circuit of claim 1, wherein the reference voltage generator includes a first transistor, a resistor, and a second transistor coupled in series,
   wherein output terminals of the first and second amplifiers are coupled to gates of the first and second transistors, respectively,
   wherein the first reference node is coupled to and disposed between the first transistor and the resistor, and
   wherein the second reference node is coupled to and disposed between the second transistor and the resistor.

3. The reference voltage supply circuit of claim 2, wherein the first transistor is a p-type transistor, and the second transistor is an n-type transistor.

4. The reference voltage supply circuit of claim 1, wherein the glitch remover includes:
   a third transistor coupled to and disposed between the power supply terminal and the first reference node; and
   a fourth transistor coupled to and disposed between the second reference node and the ground terminal.

5. The reference voltage supply circuit of claim 4, wherein the input pulse signal includes first and second pulses that are applied to gates of the third and fourth transistors, respectively, and
   wherein the third and fourth transistors are turned on for the predetermined time when the first and second pulses are applied to their gates, respectively.

6. The reference voltage supply circuit of claim 5, wherein the first pulse is applied in an inverted form of the second pulse, and
   wherein the first and second pulses are synchronized with a clock signal that drives a switch for coupling the first and second reference nodes with the external circuit and activated for the predetermined time as soon as the clock signal is activated.

7. The reference voltage supply circuit of claim 6, further comprising a pulse generator configured to generate the first and second pulses, wherein the pulse generator includes:
   a NAND gate configured to receive the clock signal and a delayed clock signal that has passed through an odd number of inverters;
   at least one inverter coupled to an output terminal of the NAND gate and configured to output the first and second pulses; and
   the odd number of inverters coupled in series and configured to receive the clock signal and output the delayed clock signal.

8. The reference voltage supply circuit of claim 4, wherein the third transistor is a p-type transistor, and the fourth transistor is an n-type transistor.

9. A reference voltage supply circuit, comprising:
   a reference voltage generator including first and second resistors coupled in series and disposed between a power supply terminal and a ground terminal, and configured to provide a reference voltage to a connection node of the first and second resistors, a level of the reference voltage being determined based on resistance values of the first and second resistors; and
   a glitch remover configured to couple the connection node to the power supply terminal and the ground terminal in response to an input pulse signal for a predetermined time after the reference voltage generator is coupled to an external circuit through the connection node.

10. The reference voltage supply circuit of claim 9, wherein the glitch remover includes:
    a first switch coupled to and disposed between the power supply terminal and the connection node; and
    a second switch coupled to and disposed between the connection node and the ground terminal,
    wherein the input pulse signal includes first and second pulses that are applied to the first and second switches, respectively, to turn on the first and second switches and
    wherein the first and second pulses are synchronized with a clock signal that drives a switch for coupling the connection node to the external circuit and activated for the predetermined time as soon as the clock signal is activated.

11. The reference voltage supply circuit of claim 10, wherein the first switch is a p-type transistor, and the second switch is an n-type transistor.

12. The reference voltage supply circuit of claim 10, further comprising a pulse generator configured to generate the first and second pulses, wherein the pulse generator includes:
    a NAND gate configured to receive the clock signal and a delayed clock signal that has passed through an odd number of inverters;
    at least one inverter coupled to an output terminal of the NAND gate and configured to output the first and second pulses; and
    the odd number of inverters coupled in series and configured to receive the clock signal and output the delayed clock signal.

13. A reference voltage supply circuit, comprising:
    a reference voltage generator including an amplifier configured to amplify an input voltage and a reference voltage and output the reference voltage through a reference node; and
    a glitch remover configured to couple the reference node to a power supply terminal and a ground terminal in response to an input pulse signal for a predetermined time after the reference voltage generator is coupled to an external circuit.

14. The reference voltage supply circuit of claim 13, wherein the reference voltage is generated from an output terminal of the amplifier.

15. The reference voltage supply circuit of claim 14, wherein the glitch remover includes:

a first switch coupled to and disposed between the power supply terminal and the reference node; and a second switch coupled to and disposed between the reference node and the ground terminal, wherein the input pulse signal includes first and second pulses that are applied to the first and second switches, respectively, to turn on the first and second switches, and wherein the first and second pulses are synchronized with a clock signal that drives a switch for coupling the reference node to the external circuit and activated for the predetermined time as soon as the clock signal is activated.

16. The reference voltage supply circuit of claim 15, wherein the first switch is a p-type transistor, and the second switch is an n-type transistor.

17. The reference voltage supply circuit of claim 15, further comprising a pulse generator configured to generate the first and second pulses, wherein the pulse generator includes:

a NAND gate configured to receive the clock signal and a delayed clock signal that has passed through an odd number of inverters;

at least one inverter coupled to an output terminal of the NAND gate and configured to output the first and second pulses; and the odd number of inverters coupled in series and configured to receive the clock signal and output the delayed clock signal.

\* \* \* \* \*